United States Patent
Kitagawa et al.

(10) Patent No.: US 8,530,887 B2
(45) Date of Patent: Sep. 10, 2013

(54) MAGNETORESISTIVE ELEMENT, METHOD OF MANUFACTURING THE SAME, AND MAGNETIC MEMORY

(75) Inventors: Eiji Kitagawa, Yokohama (JP); Tadashi Kai, Tokyo (JP); Tadaomi Daibou, Yokohama (JP); Yutaka Hashimoto, Kawasaki (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 13/050,692

(22) Filed: Mar. 17, 2011

(65) Prior Publication Data
US 2011/0227179 A1 Sep. 22, 2011

(30) Foreign Application Priority Data
Mar. 17, 2010 (JP) .................................. 2010-60903

(51) Int. Cl.
H01L 27/15 (2006.01)
(52) U.S. Cl.
USPC 257/30; 257/421; 257/E43.004; 257/E43.006; 257/E49.004
(58) Field of Classification Search
USPC .............. 257/30, 421, E43.004, E43.006, 257/E49.004; 438/238; 365/158
See application file for complete search history.

(56) References Cited

U.S. PATENT DOCUMENTS

| | | | |
|---|---|---|---|
| 7,535,069 B2 | 5/2009 | Abraham et al. | |
| 8,072,714 B2 * | 12/2011 | Sato et al. | 360/324.2 |
| 8,139,325 B2 | 3/2012 | Tsunekawa et al. | |
| 2006/0098354 A1 * | 5/2006 | Parkin | 360/324.2 |
| 2006/0221510 A1 * | 10/2006 | Parkin | 360/324.2 |
| 2007/0053114 A1 * | 3/2007 | Uesugi et al. | 360/324.2 |
| 2008/0112093 A1 * | 5/2008 | Sato et al. | 360/324.2 |
| 2008/0182015 A1 * | 7/2008 | Parkin | 427/131 |
| 2008/0278867 A1 * | 11/2008 | Fukumoto et al. | 360/324.12 |
| 2009/0141410 A1 | 6/2009 | Jogo et al. | |
| 2009/0243008 A1 | 10/2009 | Kitagawa et al. | |
| 2010/0316890 A1 | 12/2010 | Choi et al. | |
| 2011/0163400 A1 | 7/2011 | Ono | |
| 2011/0164448 A1 * | 7/2011 | Sato et al. | 365/158 |
| 2011/0227179 A1 * | 9/2011 | Kitagawa et al. | 257/421 |

FOREIGN PATENT DOCUMENTS

| | | |
|---|---|---|
| JP | 2007-335861 A | 12/2007 |
| JP | 2008-124322 A | 5/2008 |
| JP | 2009-140952 A | 6/2009 |
| JP | 2009-239120 A | 10/2009 |

(Continued)

OTHER PUBLICATIONS

J. Hayakawa et al., "Effect of high annealing temperature on giant tunnel magnetoresistance ratio of CoFeB/MgO/CoFeB magnetic tunnel junctions", Applied Physics Letters, vol. 89, 232510 (2006).
S.V. Karthik et al., "Transmission electron microscopy investigation of CoFeB/MgO/CoFeB pseudospin valves annealed at different temperatures", Journal of Applied Physics, vol. 106, 023920 (2009).

(Continued)

*Primary Examiner* — George Fourson, III
(74) *Attorney, Agent, or Firm* — Knobbe, Martens, Olson, & Bear, LLP

(57) ABSTRACT

A magnetoresistive element according to an embodiment includes: a first magnetic layer; a tunnel barrier layer on the first magnetic layer; a second magnetic layer placed on the tunnel barrier layer and containing CoFe; and a nonmagnetic layer placed on the second magnetic layer, and containing nitrogen and at least one element selected from the group consisting of B, Ta, Zr, Al, and Ce.

12 Claims, 12 Drawing Sheets

(56) References Cited

FOREIGN PATENT DOCUMENTS

| WO | WO 2008/155996 A1 | 12/2008 |
| WO | WO 2009/054062 A1 | 4/2009 |
| WO | WO 2009/110119 A1 | 9/2009 |

OTHER PUBLICATIONS

Notice of Reasons for Rejection mailed by the JPO on jan. 31, 2012, for Japanese Patent Application No. 2010-060903.

* cited by examiner

US 8,530,887 B2

MAGNETORESISTIVE ELEMENT, METHOD OF MANUFACTURING THE SAME, AND MAGNETIC MEMORY

CROSS-REFERENCE TO RELATED APPLICATION

This application is based upon and claims the benefit of priority from prior Japanese Patent Application No. 2010-60903 filed on Mar. 17, 2010 in Japan, the entire contents of which are incorporated herein by reference.

FIELD

Embodiments described herein relate generally to a magnetoresistive element, a method of manufacturing the magnetoresistive element, and a magnetic memory.

BACKGROUND

Magnetoresistive elements each having a MTJ (Magnetic Tunnel Junction) film formed by CoFeB/MgO/CoFeB (hereinafter, "/" will be used as "an upper layer/a lower layer" in relation to the substrate) have high magnetoresistance ratios (MR ratios), and therefore, have been under consideration for the use in the fields of MRAMs (Magnetic Random Access Memories), magnetic heads, and magnetic sensors. To achieve a high MR ratio with a MTJ film formed by CoFeB/MgO/CoFeB, the MTJ film needs to be subjected to a heat treatment at a temperature of about 500° C. The reason that a 500° C. heat treatment is performed on the MTJ film formed by CoFeB/MgO/CoFeB is that 500° C. is the crystallization temperature at which $Co_{40}Fe_{40}B_{20}$ in an amorphous state is crystallized. For example, the transformation temperature at which CoFeB in an amorphous state turns into CoFeB in a crystallized state becomes higher as the B density becomes higher. When the B density is about 20%, the transformation temperature reaches 500° C.

However, the 500° C. heat treatment performed on the MTJ film formed by CoFeB/MgO/CoFeB induces diffusion of other elements forming the magnetoresistive element. Therefore, the 500° C. heat treatment cannot be performed on MTJ films formed by CoFeB/MgO/CoFeB used in MRAMs. For example, in a typical spin-valve film, a stacked film such as CoFeB/MgO/CoFeB/Ru/CoFe/PtMn is used. When this stacked film is subjected to a heat treatment at 400° C. or higher, mutual diffusion occurs among the elements contained in the synthetic antiferromagnetically-coupled film. The synthetic antiferromagnetic coupling is degraded, and the MR ratio becomes lower. Also, the Mn in the antiferromagnetic film made of PtMn diffuses into the MTJ formed by CoFeB/MgO/CoFeB, and the spin polarizability becomes lower, which leads to a reduction of the MR ratio. Further, in the synthetic antiferromagnetically-coupled film formed by CoFeB/Ru/CoFe, the synthetic antiferromagnetic coupling is broken due to the mutual diffusion among the respective elements, and the magnetization directions of the CoFeB layer and the CoFe layer become parallel to each other. Due to a magnetic field leaking from the CoFeB layer, a shift is caused in the magnetization characteristics of the CoFeB layer as the recording layer, resulting in the problem of write errors.

By conventional techniques, the upper limit of the temperature that can be applied to a MTJ is about 350° C., and therefore, it is difficult to achieve a high MR ratio. If a MTJ film formed by CoFeB/MgO/CoFeB can be completely crystallized at a temperature as low as 350° C., a magnetoresistive element having a high MR ratio can be obtained. In that case, the read output can be improved, and the spin polarizability can be made higher, which leads to a reduction of the write current. However, there have been neither reports nor specific methods suggested to achieve a high MR ratio by accelerating crystallization of the CoFeB layer through a low-temperature heat treatment performed on a MTJ film formed by CoFeB/MgO/CoFeB.

DETAILED DESCRIPTION

Figure 1:
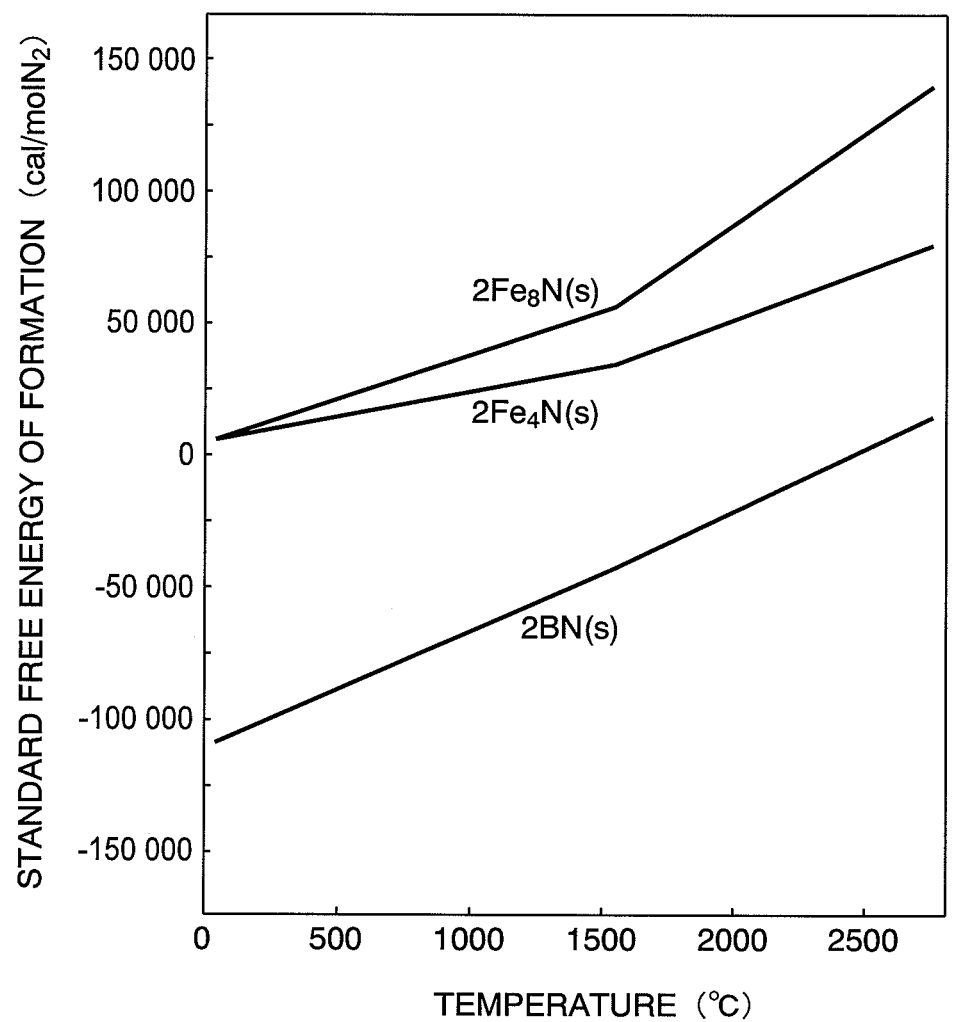
FIG. 1 is a diagram showing standard free energies of formation of B and Fe in relation to nitrogen.

A magnetoresistive element according to an embodiment includes a first magnetic layer, a tunnel barrier layer provided on the first magnetic layer, a second magnetic layer provided on the tunnel barrier layer and containing CoFe, and a nonmagnetic layer provided on the second magnetic layer, and containing nitrogen and at least one element selected from the group consisting of B, Ta, Zr, Al, and Ce.

Before the embodiments are described, the course of events before the present inventors achieved the present invention will be described below.

In the following description, components having like functions and structures are denoted by like reference numerals, and explanation of them is not repeated unless necessary.

First, crystallization of a CoFeB film by a nitrogen plasma heat treatment, which is used in manufacturing the magnetoresistive element of each embodiment, is described.

FIG. 1 shows the standard free energies of formation of B and Fe with respect to nitrogen. As can be seen from FIG. 1, the standard free energy of formation is positive in a reaction of Fe to turn into a nitride, and therefore, it is difficult to form a nitride of Fe. On the other hand, the standard free energy of formation of B is negative, and therefore, a nitride of B can be readily formed. Although not shown, Co is more difficult to be oxidized than Fe, and therefore, the standard free energy of formation of Co is also considered to be positive in a reaction of Co to turn into a nitride. For example, when a reaction is caused between CoFeB and nitrogen, B is nitrided, but Co and Fe are not easily nitrided. Accordingly, it is possible to selectively nitride only B. However, nitrogen is inert, stable gaseous matter. Therefore, even when CoFeB is exposed to a nitrogen atmosphere, the Co and Fe in the CoFeB are hardly nitrided.

In view of this, the inventors exposed CoFeB to a nitrogen plasma atmosphere in which nitrogen was turned into plasma. As a result, the inventors discovered that the B in the CoFeB selectively reacted with the nitrogen plasma to form BN (boron nitride).

Figure 2:
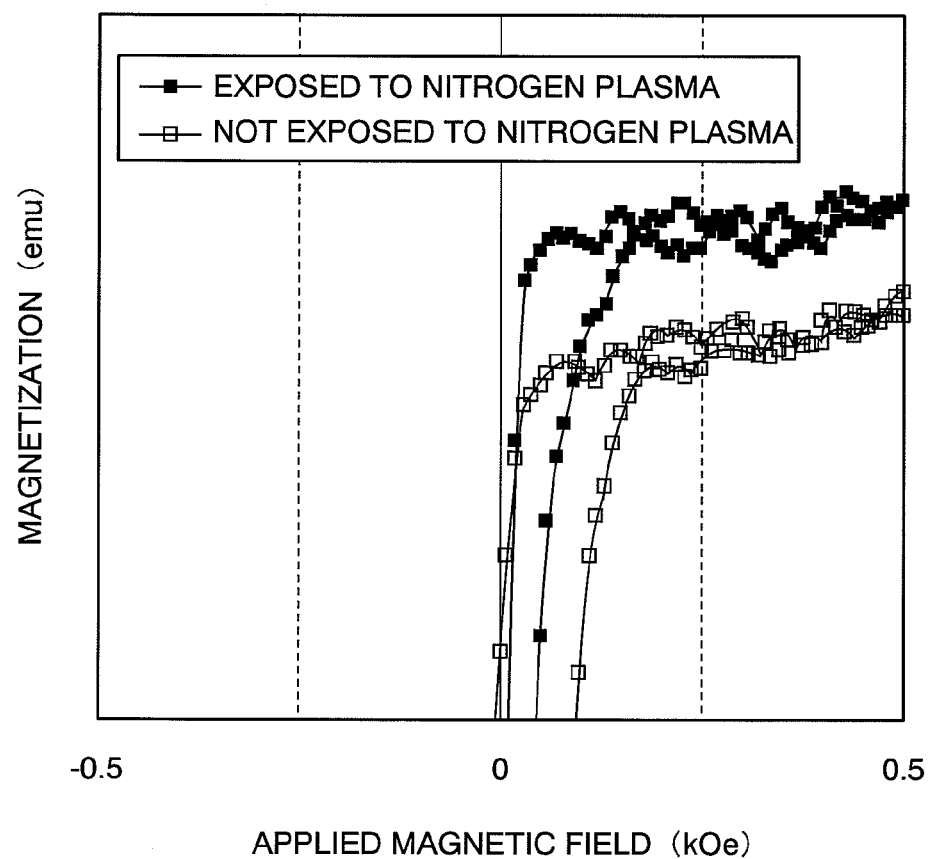
FIG. 2 is a diagram showing the results of measurement carried out on M-H curves of samples exposed to nitrogen plasma and samples not exposed to nitrogen plasma.

The inventors further measured M-H curves of samples exposed to nitrogen plasma at a temperature of 300° C. and samples heated to 300° C. in vacuum, after CoFeB film formation. FIG. 2 shows the results of the measurement. As can be seen from FIG. 2, the saturation magnetization Ms of each sample subjected to a heat treatment in nitrogen plasma showed a larger increase than the saturation magnetization Ms of each sample subjected to a heat treatment in vacuum. The increases in the saturation magnetization Ms represent crystallization of amorphous CoFeB into crystalline CoFe, and indicate that the heat treatment in nitrogen plasma accelerated crystallization of CoFeB. It should be noted that, to accelerate crystallization of CoFeB in nitrogen plasma, heating needs to be performed at 300° C. or higher, since each of the elements, Co, Fe, and B, needs to move.

Figure 3:
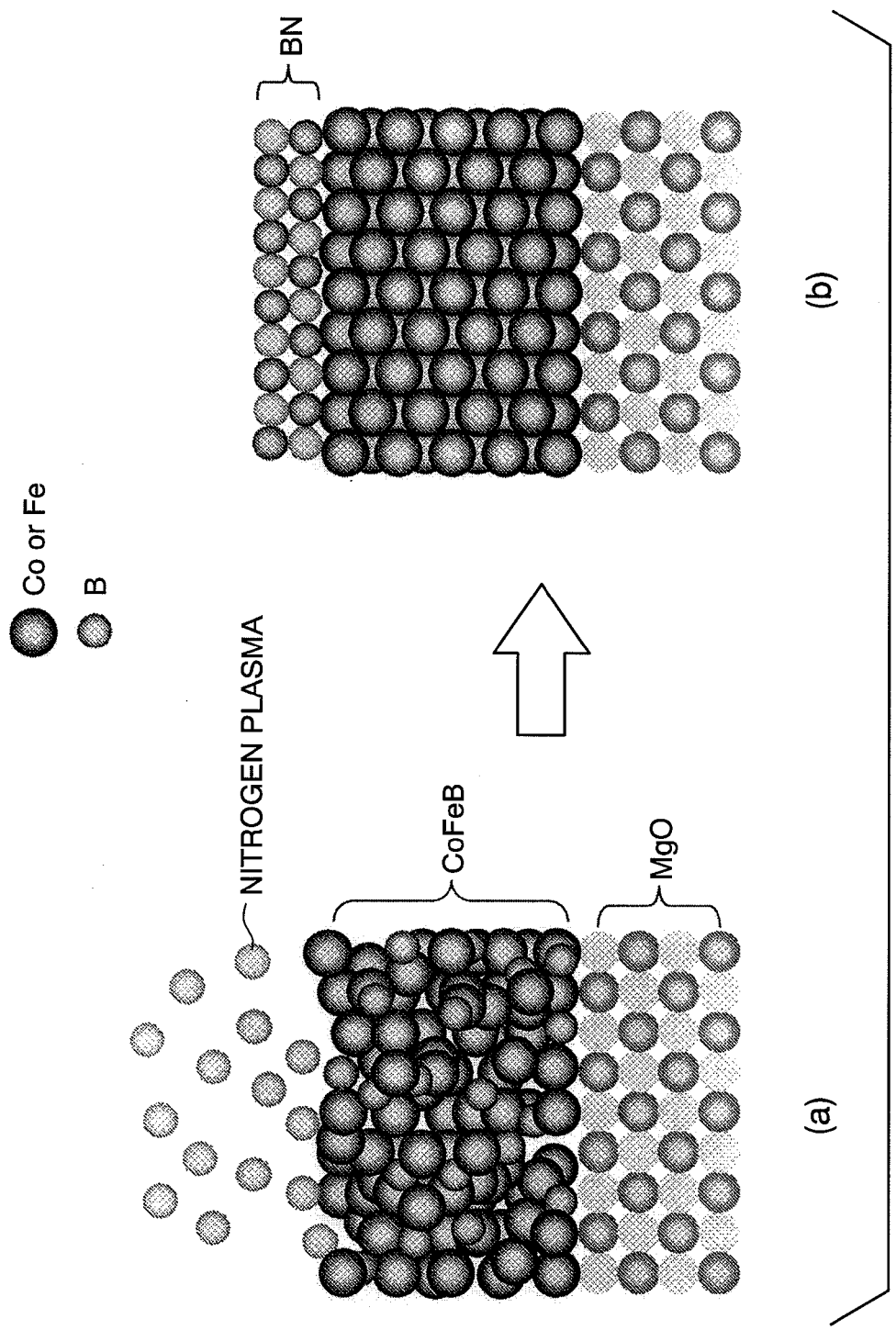
FIGS. 3(a) and 3(b) are diagrams for explaining crystallization of CoFeB in nitrogen plasma.

FIGS. 3(a) and 3(b) are schematic views of crystallization of CoFeB in nitrogen plasma. FIG. 3(a) illustrates a condition seen before CoFeB is nitrided, and FIG. 3(b) illustrates a condition seen after the CoFeB is nitrided. Since the CoFeB is in an amorphous state immediately after the film formation, the atoms are randomly arranged at this point. After a heat treatment is performed in nitrogen plasma, the B is selectively nitrided, and is detached from the CoFeB. As a result, the CoFeB turns into CoFe. As the density of B becomes lower after the B is detached from the CoFeB, the crystallization temperature of the CoFeB becomes lower. Accordingly, a crystallized CoFe layer is formed on the MgO layer. That is, an acceleration of CoFeB crystallization on the MgO layer is enabled by performing a heat treatment at a low temperature, and a high MR ratio can be achieved.

First Embodiment

Figure 4:
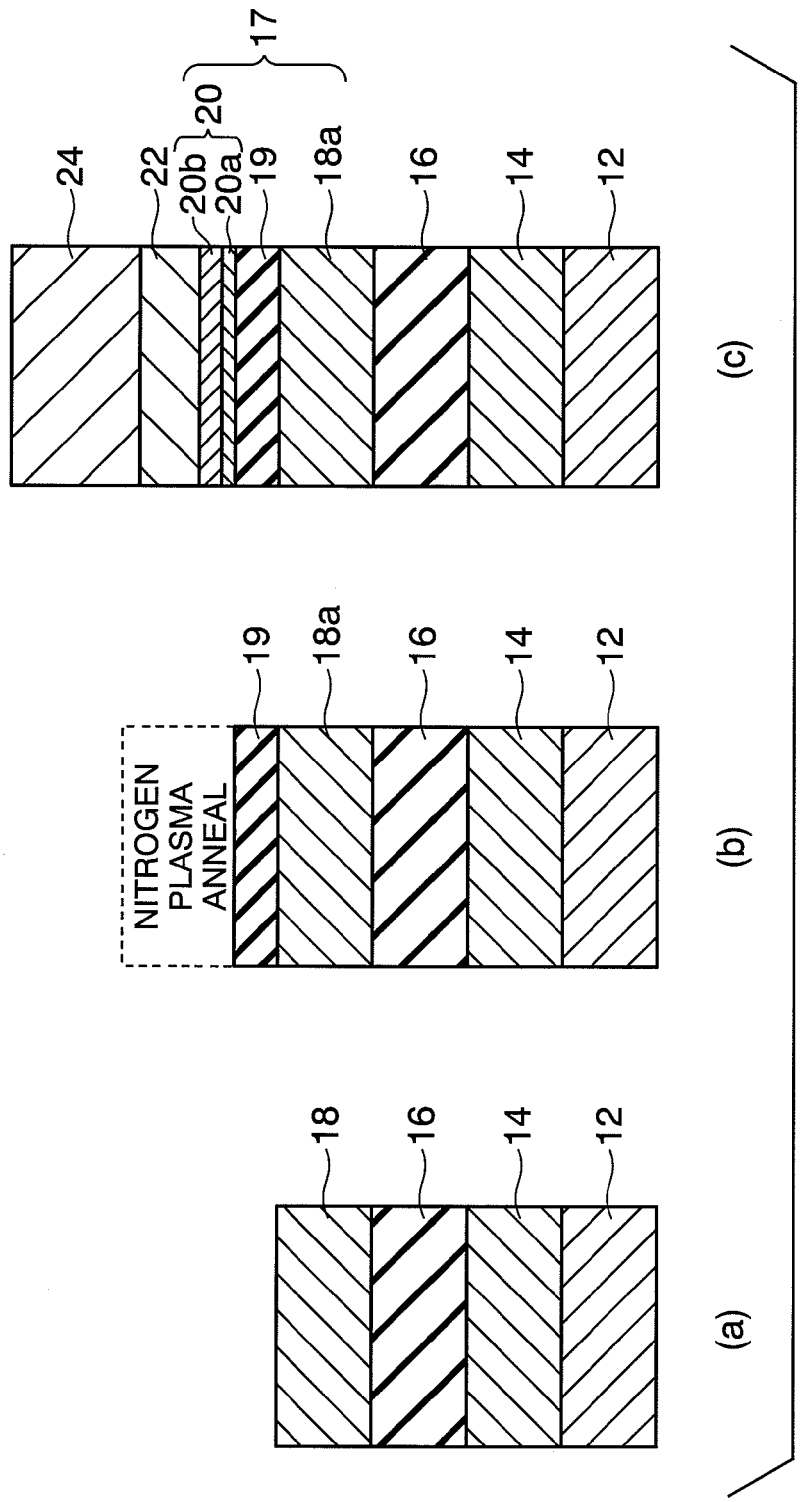
FIGS. 4(a) through 4(c) are cross-sectional views showing procedures for manufacturing a magnetoresistive element of a first embodiment.

Referring now to FIGS. 4(a) through 4(c), a method of manufacturing a magnetoresistive element according to a first embodiment is described. In the magnetoresistive element of the first embodiment, the magnetization directions (magnetic anisotropy) of the magnetic recording layer and the magnetic reference layer are substantially parallel to the film plane. The magnetization direction of the magnetic recording layer can be switched by applying a current between the lower electrode and the upper electrode. The magnetization direction of the magnetic reference layer is fixed.

First, as shown in FIG. 4(a), a 3-nm thick CoFeB layer 14 as the magnetic recording layer, a 1-nm thick MgO layer 16 as the tunnel barrier layer, and a 2.5-nm thick amorphous CoFeB layer 18 to be the magnetic reference layer are formed sequentially on a lower electrode 12. After that, the resultant structure is heated to 300° C., and is further exposed to nitrogen plasma, as shown in FIG. 4(b). As a result, the B in the CoFeB layer 18 in the amorphous state is selectively nitrided, and is detached from the CoFeB layer 18 in the amorphous state. The CoFeB layer 18 in the amorphous state then turns into a CoFe layer 18a in a crystallized state. The region near the upper face of the CoFe layer 18 in the crystallized state may contain N. Since the crystallization temperature of a CoFeB layer becomes lower after B is detached from the CoFeB layer, the crystallized CoFe layer 18a is formed on the MgO layer 16. The B detached from the CoFeB layer 18 then binds to nitrogen, to form a BN layer 19 on the CoFe layer 18a. The BN layer 19 may be regarded as a compound of B and N, but may also be regarded simply as a layer 19 containing B and N, since the film thickness of the BN layer 19 is equivalent to a few atoms. The BN layer 19 is also a nonmagnetic layer. It should be noted that the CoFe layer 18a may contain B and N.

A stacked film 20 formed by a 0.9-nm thick Ru layer 20a and a 2.5-nm thick Co layer 20b, an antiferromagnetic layer 22 formed by a 10-nm thick IrMn layer, and an upper electrode 24 formed by a 20-nm thick Ru layer are formed sequentially on the BN layer 19, as shown in FIG. 4(c). The CoFe layer 18a and the Co layer 20b form synthetic antiferromagnetic coupling via the BN layer 19 and the Ru layer 20a. The CoFe layer 18a, the BN layer 19, and the stacked film 20 function as a synthetic magnetic reference layer 17. The IrMn layer 22 fixes the magnetization of the magnetic reference layer 17 in a direction substantially parallel to the film plane. After the magnetoresistive element is formed in this manner, a 1-hour heat treatment is performed in a magnetic field at 300° C., to complete the magnetoresistive element.

As a comparative example, a magnetoresistive element subjected to a heat treatment in vacuum, instead of a heat treatment in nitrogen plasma, is formed. That is, a method of manufacturing the magnetoresistive element of this comparative example is as shown in FIGS. 5(a) through 5(c).

Figure 5:
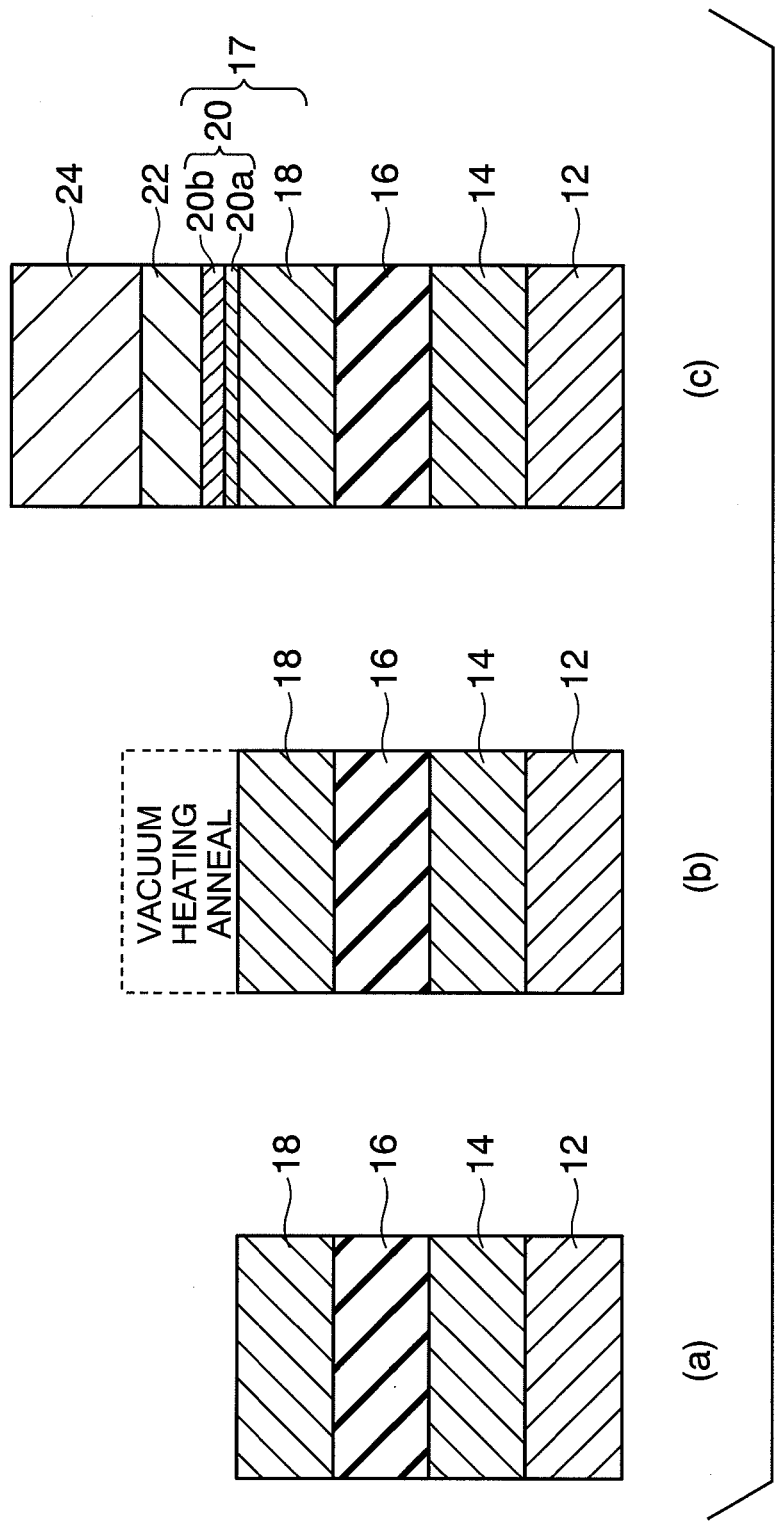
FIGS. 5(a) through 5(c) are cross-sectional views showing procedures for manufacturing a magnetoresistive element of a comparative example.

First, as shown in FIG. 5(a), a 3-nm thick CoFeB layer 14 as the magnetic recording layer, a 1-nm thick MgO layer 16 as the tunnel barrier layer, and a 2.5-nm thick CoFeB layer 18 in an amorphous state are formed sequentially on a lower electrode 12. After that, the resultant structure is heated to 300° C. in vacuum, as shown in FIG. 5(b). A stacked film 20 formed by a 0.9-nm thick Ru layer 20a and a 2.5-nm thick Co layer 20b, an antiferromagnetic layer 22 formed by a 10-nm thick IrMn layer, and an upper electrode 24 formed by a 20-nm thick Ru layer are formed sequentially on the CoFeB layer 18, as shown in FIG. 5(c). The CoFeB layer 18 and the Co layer 20b form synthetic antiferromagnetic coupling via the Ru layer 20a. The CoFeB layer 18 and the stacked film 20 function as a synthetic magnetic reference layer 17. After the magnetoresistive element of this example is formed in this manner, a 1-hour heat treatment is performed in a magnetic field at 300° C., to complete the magnetoresistive element of this example.

Figure 6:
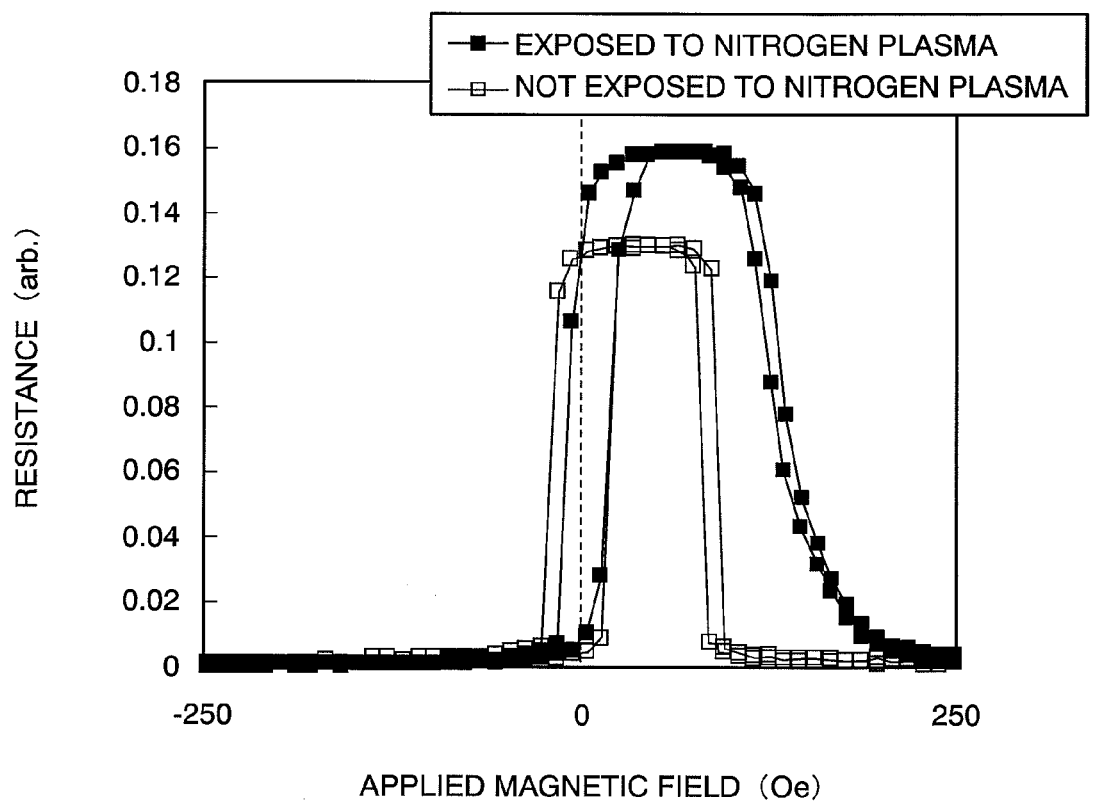
FIG. 6 is a graph showing the resistance characteristics of the first embodiment and the comparative example in relation to an applied magnetic field.

FIG. 6 shows the results of measurement carried out on the resistance with respect to each applied magnetic field of the magnetoresistive element of the first embodiment and the magnetoresistive element of the comparative example. The solid-black points indicate the results of the measurement carried out on the first embodiment, and the white points indicate the results of the measurement carried out on the comparative example. As can be seen from FIG. 6, the resistance change is larger in the first embodiment than in the comparative example. As for MR ratios, the first embodiment shows a MR ratio of 91% (with the lowest resistance being 30 ($\mu m^2$)), and the comparative example shows a MR ratio of 67% (with the lowest resistance being 33 (μm²)). Therefore, the MTJ of the first embodiment has the larger value, in terms of MR ratio.

As is apparent from the above description, exposure to nitrogen plasma after the formation of a MTJ film formed by CoFeB/MgO/CoFeB is essential, and other film structures may be arbitrarily changed. For example, a first modification of the first embodiment may be formed in the manner as illustrated in FIGS. 7(a) through 7(c).

The method of manufacturing the magnetoresistive element of the first modification is as follows. First, as shown in FIG. 7(a), a 15-nm thick PtMn layer 23, a synthetic antiferromagnetically-coupled film 17 as the magnetic reference layer formed by stacking a 3-nm thick CoFe layer 20b, a 0.9-nm thick Ru layer 20a, and a 2.5-nm thick CoFeB layer 18 in this order, a 1-nm thick MgO layer 16 as the tunnel barrier layer, and a 2.5-nm thick CoFeB layer 14 to be the magnetic recording layer are formed sequentially on a lower electrode 12.

Figure 7:
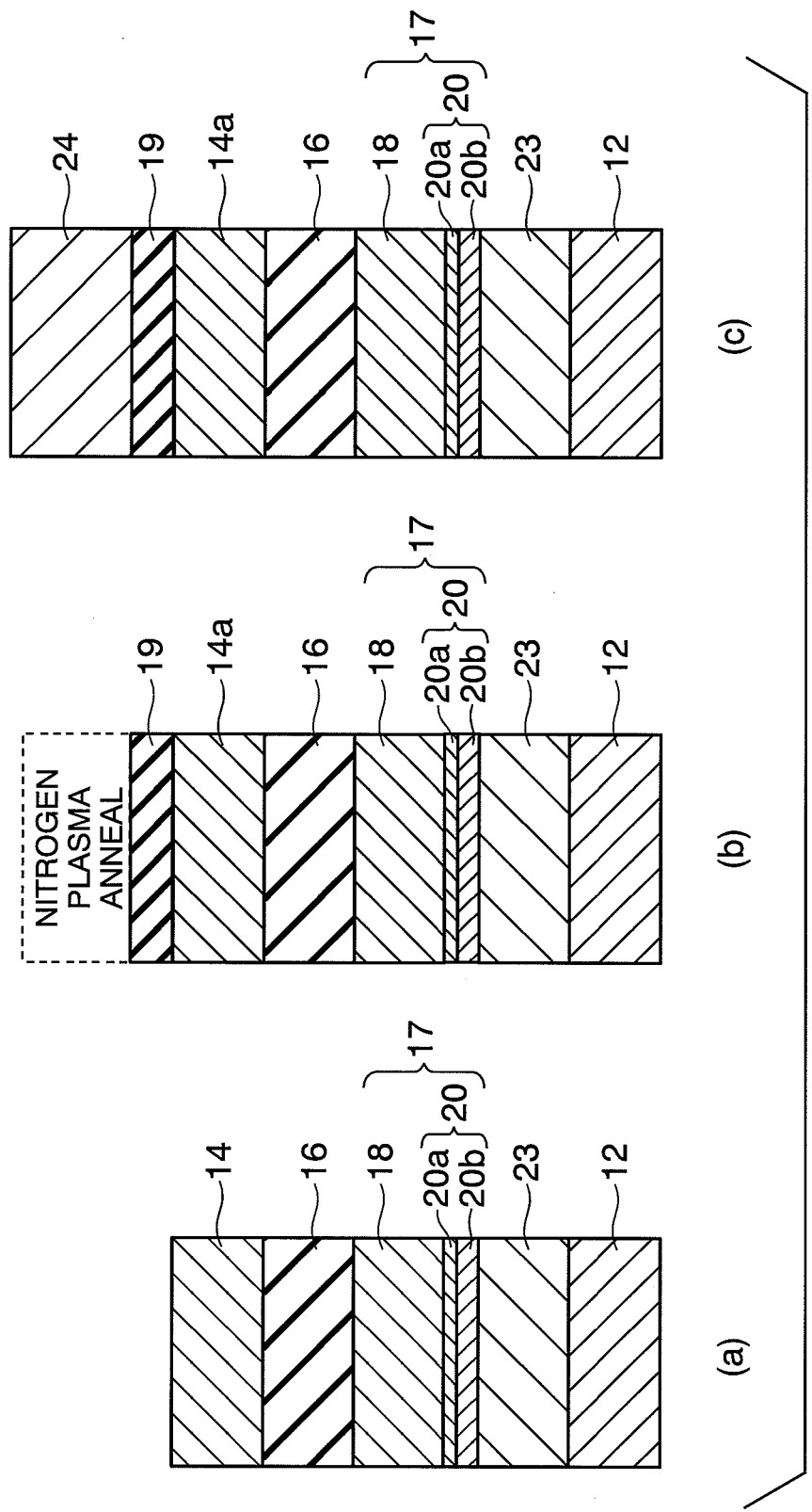
FIGS. 7(a) through 7(c) are cross-sectional views showing procedures for manufacturing a magnetoresistive element according to a first modification of the first embodiment.

After that, the resultant structure is heated to 300° C., and is further exposed to nitrogen plasma, as shown in FIG. 7(b). At this point, as in the first embodiment shown in FIG. 4(b), the B in the CoFeB layer 14 is selectively nitrided and detached from the CoFeB, and the CoFeB layer 14 turns into a CoFe layer 14a. The B detached from the CoFeB layer 14 then binds to nitrogen, to form a BN layer 19 on the CoFe layer 14a. The region in the vicinity of the upper face of the CoFe layer 14a may contain B and N.

An upper electrode 24 is then formed, and a magnetoresistive element is formed as shown in FIG. 7(c). After that, a 1-hour heat treatment is performed in a magnetic field at 300° C., to complete the magnetoresistive element. Like the magnetoresistive element of the first embodiment, the magnetoresistive element of the first modification is exposed to nitrogen plasma after the formation of the MTJ film. Accordingly, a high MR ratio can also be achieved by this modification.

Figure 8:
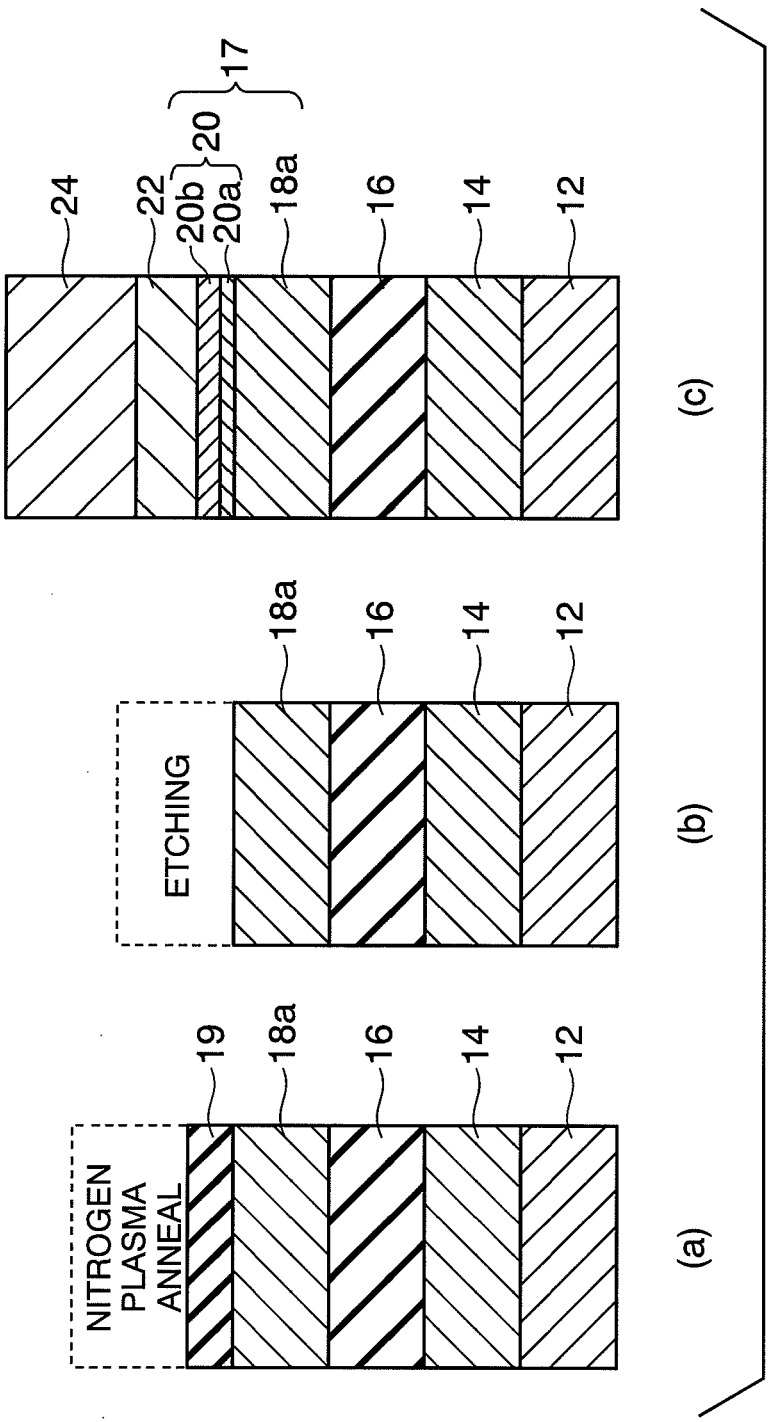
FIGS. 8(a) through 8(c) are cross-sectional views showing procedures for manufacturing a magnetoresistive element according to a second modification of the first embodiment.

Referring now to FIGS. 8(a) through 8(c), a second modification of the first embodiment is described.

The same procedures as those of the first embodiment are carried out until exposure to nitrogen plasma. That is, when exposure to nitrogen plasma is ended, the BN layer 19 is already formed on the CoFe layer 18a, as shown in FIG. 8(a). The BN layer 19 serves as a resistor formed in series with the tunnel barrier layer 16 made of MgO. Therefore, the BN layer 19 may be removed by plasma etching with the use of an Ar or Kr gas, or may be thinned. However, it is necessary to perform etching with such a small energy as not to damage the CoFe/MgO/CoFeB during the etching with the use of the Ar or Kr gas. The region in the vicinity of the upper face of the CoFe layer 18a after the removal of the BN layer 19 may contain N.

After the end of the etching, as in the first embodiment, a stacked film 20 formed by a 0.9-nm thick Ru layer 20a and a 2.5-nm thick Co layer 20b, a 10-nm thick IrMn layer 22, and an upper electrode 24 formed by a 20-nm thick Ru layer are formed sequentially on the CoFe layer 18a, as shown in FIG. 8(c). The CoFe layer 18a and the Co layer 20b form synthetic antiferromagnetic coupling via the Ru layer 20a. The CoFe layer 18a and the stacked film 20 form the magnetic reference layer 17. After that, a 1-hour heat treatment is performed in a magnetic field at 300° C., to complete the magnetoresistive element of the second modification.

Like the first embodiment, the second modification is exposed to nitrogen plasma after the MTJ film is formed. Accordingly, a high MR ratio can also be achieved by this modification. It should be noted that, in the first modification, the BN layer 19 may be removed by plasma etching with the use of an Ar or Kr gas, or may be thinned as in the second modification.

Instead of the CoFeB layer exposed to nitrogen plasma, a ferromagnetic layer such as a CoFeTa layer, a CoFeZr layer, a CoFeAl layer, a CoFeCe layer, or a CoFeBTa layer may be used. That is, a ferromagnetic layer to which at least one element selected from the group consisting of B, Ta, Zr, Al, and Ce is added may be used. In that case, the content of each of the elements, B, Ta, Zr, Al, and Ce, in relation to CoFe is preferably such that the amorphous layer at the time of film formation is stabilized. After the exposure to nitrogen plasma, a BN layer, a TaN layer, a ZrN layer, an AlN layer, a CeN layer, or a BTaN layer is formed on the crystallized CoFe layer. Those nitride layers may be removed by performing etching with the use of an Ar or Kr gas, as described in the second modification.

As described above, according to the first embodiment and its modifications, a heat treatment is performed at a low temperature. Accordingly, crystallization of the CoFeB layer on the MgO layer can be accelerated, and a magnetoresistive element having a high MR ratio can be obtained.

Second Embodiment

Figure 9:
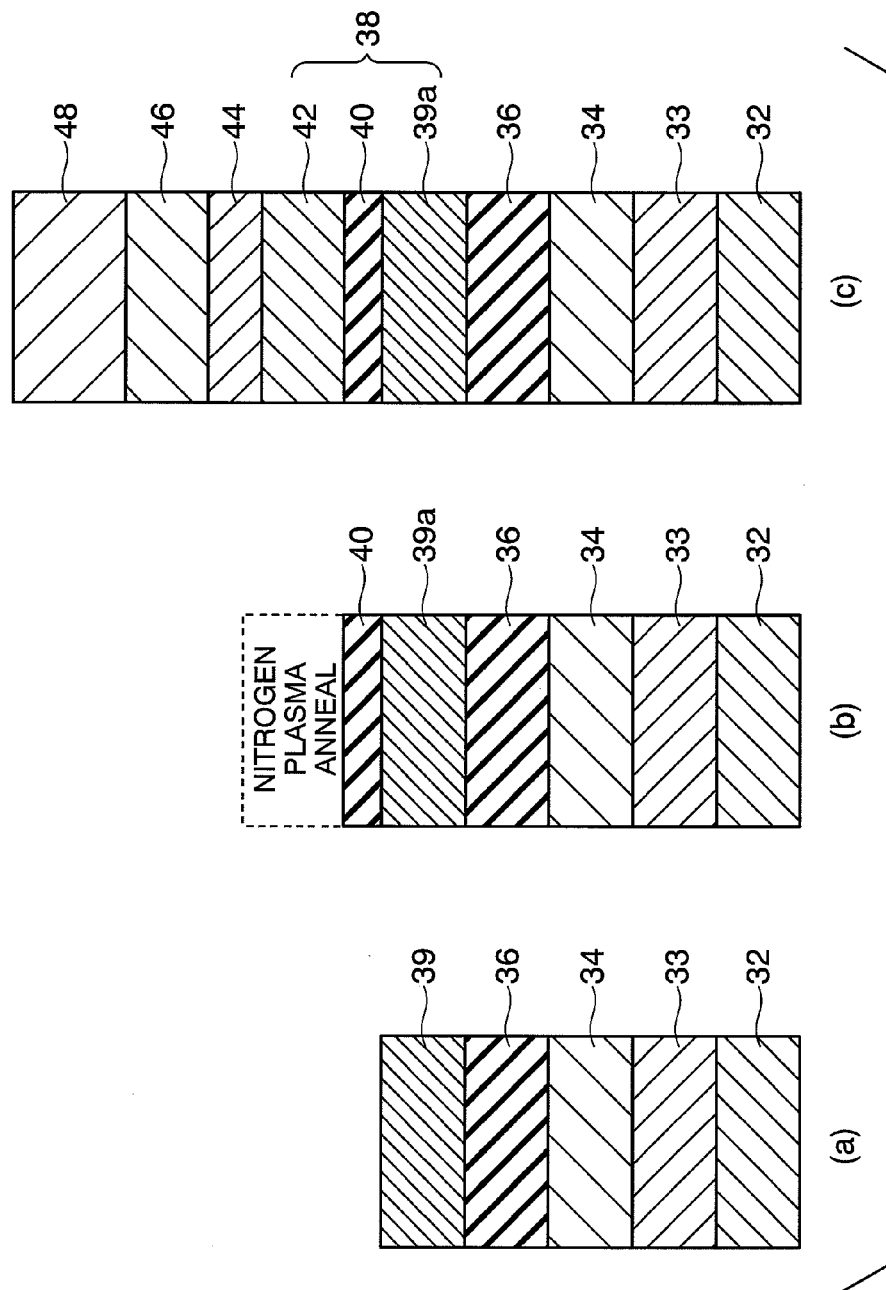
FIGS. 9(a) through 9(c) are cross-sectional views showing procedures for manufacturing a magnetoresistive element according to a second embodiment.

Referring now to FIGS. 9(a) through 9(c), a method of manufacturing a magnetoresistive element according to a second embodiment is described. In the magnetoresistive element of the second embodiment, the magnetization directions (magnetic anisotropy) of the magnetic recording layer and the magnetic reference layer are substantially perpendicular to the film plane. The magnetization direction of the magnetic recording layer can be switched by applying a current between the lower electrode and the upper electrode, while the magnetization direction of the magnetic reference layer is fixed. It should be noted that a fixed magnetization direction here is a magnetization direction that does not change before and after spin-polarized electrons are injected (or before and after a current is applied). The magnetoresistive element of the second embodiment has a top-pin structure, or a structure in which the magnetic reference layer having a fixed magnetization direction is formed above the magnetic recording layer.

The magnetoresistive element of the second embodiment has a stacked structure in which a lower electrode 32, a base layer 33, a magnetic recording layer 34, a tunnel barrier layer 36, a magnetic reference layer 38, a spacer layer 44, a bias layer 46, and an upper electrode 48 are stacked in this order, as shown in FIG. 9(c). The bias layer 46 and the spacer layer 44 may be formed between the magnetic recording layer 34 and the base layer 33. In that case, the spacer layer 44 is provided between the bias layer 46 and the magnetic recording layer 34. Alternatively, the spacer layer 44 and the bias layer 46 may be provided between the base layer 33 and the lower electrode 32. In that case, if the base layer 33 is a magnetic layer, the spacer layer 44 is provided between the base layer 33 and the bias layer 46. If the base layer 33 is a nonmagnetic layer, the spacer layer 44 may not be provided.

The magnetoresistive element of the second embodiment is formed in the following manner. As shown in FIG. 9(a), an Ir/Ru/Ta stacked film as the base layer 33, a CoFeB/CoPd stacked film as the magnetic recording layer 34, a MgO layer as the tunnel barrier layer 36, and a CoFeB layer 39 in an amorphous state are formed sequentially on the lower electrode 32. The CoPd layer on the base layer 33 side of the magnetic recording layer 34 has perpendicular magnetic anisotropy, and has a magnetization direction substantially perpendicular to the film plane. As a single-layer film, the CoFeB layer of the magnetic recording layer 34 has a magnetization direction substantially parallel to the film plane. However, the CoFeB layer is stacked on the CoPd layer, and therefore, the overall magnetization direction is substantially perpendicular to the film plane.

After the formation of the CoFeB layer 39, a heat treatment is performed in nitrogen plasma, as shown in FIG. 9(b). Through the heat treatment, the B in the CoFeB layer 39 in an amorphous state is detached, and the CoFeB layer 39 turns into a CoFe layer 39a in a crystallized state. A BN layer 40 is then formed on the CoFe layer 39a. The region in the vicinity of the upper face of the CoFe layer 39a may contain N.

As shown in FIG. 9(c), an artificial lattice (a ferromagnetic layer) 42 formed by stacking [Co/Pt] ten times is then formed on the BN layer 40. Instead of [Co/Pt], [Co/Pd] may be stacked ten times to form the artificial lattice 42. The artificial lattice 42 and the CoFe layer 39a form ferromagnetic coupling, and constitute the magnetic reference layer 38 in combination. A Ru layer as the spacer layer 44 is then formed on the artificial lattice 42, and a CoPd layer as the bias layer 46 for magnetic field adjustment is formed on the Ru layer 44. After that, the upper electrode 48 made of Ru, for example, is formed on the bias layer 46, to form a magnetoresistive element. A 1-hour heat treatment is then performed at 300° C., to complete the magnetoresistive element of the second embodiment. The bias layer 46 for magnetic field adjustment is provided for canceling a magnetic field leaking from the magnetic reference layer 38. Accordingly, a shift in magnetization characteristics of the magnetic recording layer is prevented.

In the second embodiment, a heat treatment in nitrogen plasma is performed after the formation of the CoFeB layer 39. Accordingly, a high MR ratio can also be achieved in the second embodiment. In conventional cases, Pd or Pt diffuses into the CoFeB layer and the MgO layer provided immediately below the CoFeB layer due to the heat treatment performed after the formation of a MTJ film, and the diffusion degrades the MR ratio. In the second embodiment, however, the B nitride (BN) formed by the heat treatment performed in nitrogen plasma can prevent the Pt in an artificial lattice [Co/Pt] or the Pd in an artificial lattice [Co/Pd] from diffusing into the CoFe layer 39a and the MgO layer 36. Accordingly, in the second embodiment, degradation of the MR ratio can be prevented, and high heat resistance during the heat treatment performed after the formation of the MTJ film can be achieved.

Figure 10:
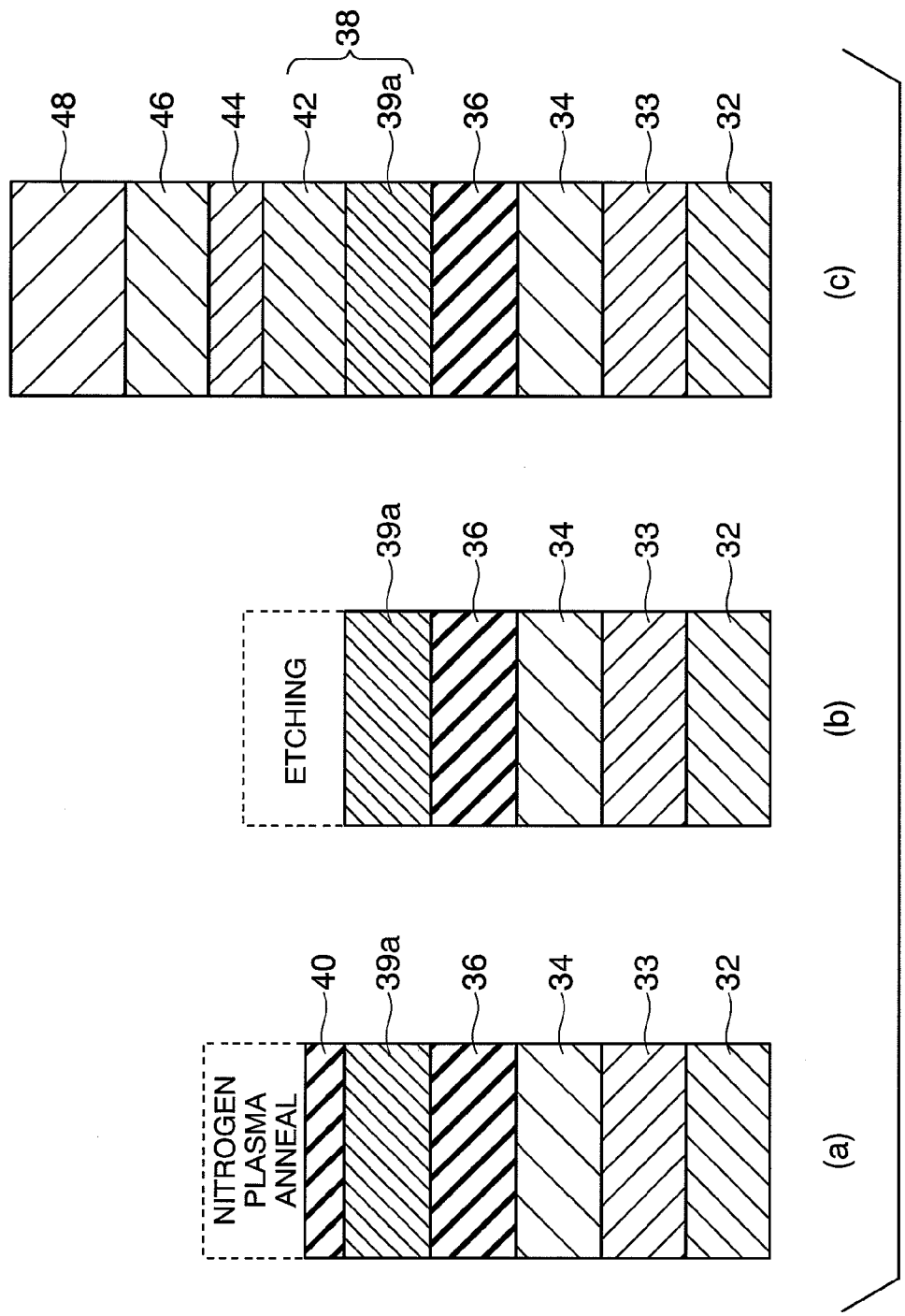
FIGS. 10(a) through 10(c) are cross-sectional views showing procedures for manufacturing a magnetoresistive element according to a modification of the second embodiment.

The B nitride (the BN layer 40) is a high-resistance layer. Therefore, to adjust resistance and reinforce the magnetic exchange coupling (ferromagnetic coupling) formed between the CoFe layer 39a and the artificial lattice 42, the B nitride may be removed or the film thickness of the BN layer 40 may be reduced, as in the second modification of the first embodiment. Referring now to FIGS. 10(a), 10(b), and 10(c), a method of manufacturing a magnetoresistive element minus the BN layer 40 is described as a modification of the second embodiment.

Up until exposure to nitrogen plasma, the same procedures as those of the second embodiment are carried out. That is, when the exposure to nitrogen plasma is ended, the BN layer 40 is already formed on the CoFe layer 39a, as shown in FIG. 10(a). The BN layer 40 is then removed by plasma etching with the use of an Ar or Kr gas, as shown in FIG. 10(b). Here, it is necessary to perform the etching with such a small energy as not to damage the CoFe layer 39a, the MgO layer 36, and the magnetic recording layer 34 during the etching with the use of an Ar or Kr gas. After the removal of the BN layer 40, the region in the vicinity of the upper face of the CoFe layer 39a may contain N.

As in the second embodiment, after the etching is ended, the artificial lattice 42 formed by stacking [Co/Pt] ten times, the spacer layer 44, the bias layer 46, and the upper electrode 48 are formed sequentially to form the magnetoresistive element of the modification. After that, a 1-hour heat treatment is performed at 300° C., to complete the magnetoresistive element of the modification of the second embodiment.

In this modification, a heat treatment in nitrogen plasma is performed after the formation of a MTJ film, as in the second embodiment. Accordingly, a high MR ratio can be achieved.

As described above, according to the second embodiment and its modification, a heat treatment is performed at a low temperature. Accordingly, crystallization of the CoFeB layer on the MgO layer can be accelerated, and a magnetoresistive element having a high MR ratio can be obtained.

Third Embodiment

Figure 11:
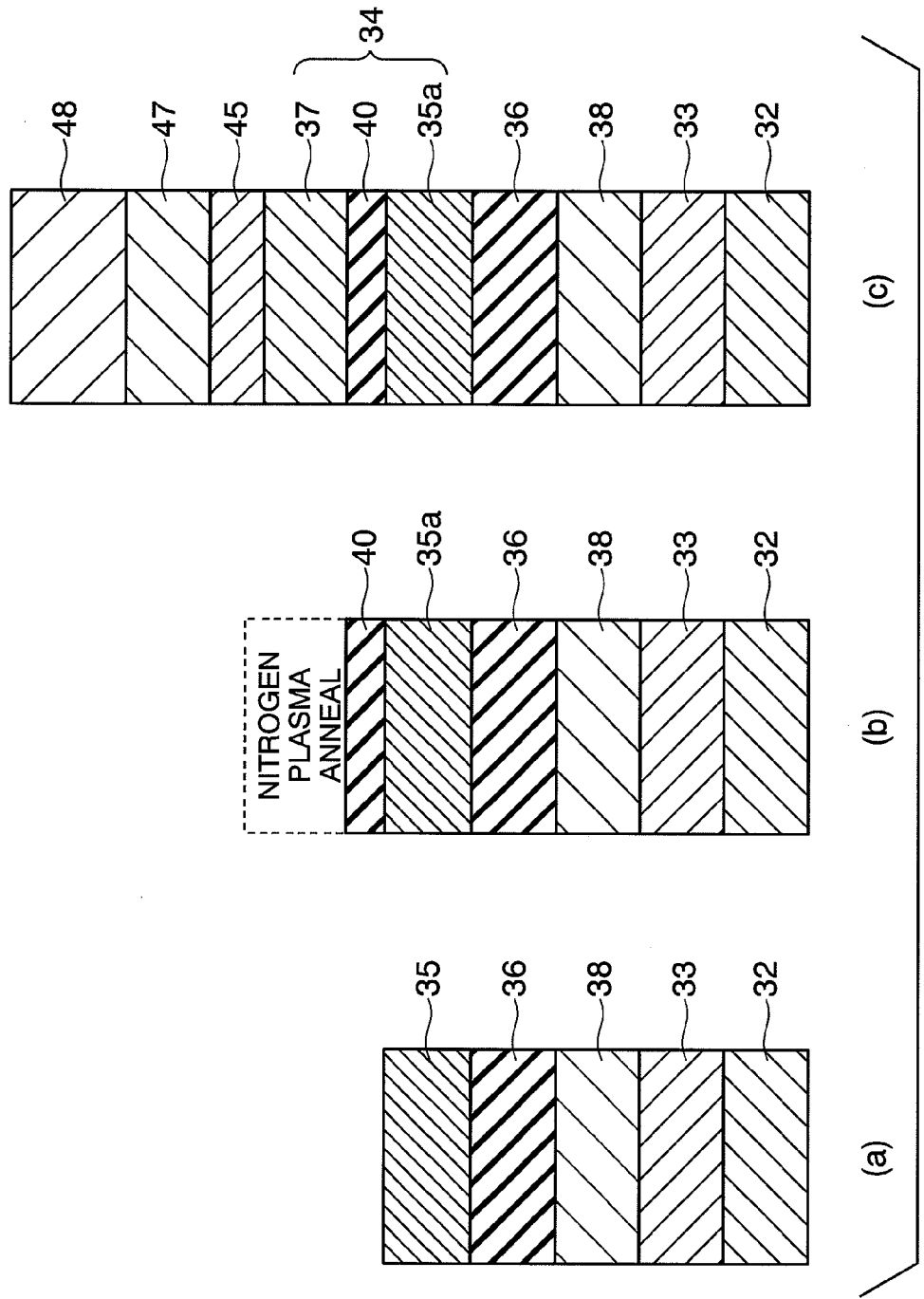
FIGS. 11(a) through 11(c) are cross-sectional views showing procedures for manufacturing a magnetoresistive element according to a third embodiment.

Referring now to FIGS. 11(a) through 11(c), a method of manufacturing a magnetoresistive element according to a third embodiment is described. In the magnetoresistive element of the third embodiment, the magnetization directions of the magnetic recording layer and the magnetic reference layer are substantially perpendicular to the film plane. The magnetization direction of the magnetic recording layer can be switched by applying a current between the lower electrode and the upper electrode, while the magnetization direction of the magnetic reference layer is fixed. The magnetoresistive element of the third embodiment has a bottom-pin structure, or a structure in which the magnetic reference layer having a fixed magnetization direction is formed under the magnetic recording layer.

The magnetoresistive element of the third embodiment has a stacked structure in which a lower electrode 32, a base layer 33, a magnetic reference layer 38, a tunnel barrier layer 36, a magnetic recording layer 34, a spacer layer 45, a bias layer 47, and an upper electrode 48 are stacked in this order, as shown in FIG. 11(c). The bias layer 47 and the spacer layer 45 may be formed between the magnetic reference layer 38 and the base layer 33. In that case, the spacer layer 45 is provided between the bias layer 47 and the magnetic reference layer 38. Alternatively, the spacer layer 45 and the bias layer 47 may be provided between the base layer 33 and the lower electrode 32. In that case, if the base layer 33 is a magnetic layer, the spacer layer 45 is provided between the base layer 33 and the bias layer 47. If the base layer 33 is a nonmagnetic layer, the spacer layer 45 may not be provided.

The magnetoresistive element of the third embodiment is formed in the following manner. As shown in FIG. 11(a), a Pt/TiN/MgO/CoFeB/Ta stacked film as the base layer 33, a CoFeB/FePt stacked film as the magnetic reference layer 38, a MgO layer as the tunnel barrier layer 36, and a CoFeB layer 35 in an amorphous state are formed sequentially on the lower electrode 32. The FePt layer on the base layer 33 side of the magnetic reference layer 38 has perpendicular magnetic anisotropy, and has a magnetization direction substantially perpendicular to the film plane. As a single-layer film, the CoFeB layer of the magnetic reference layer 38 has a magnetization direction substantially parallel to the film plane. However, the CoFeB layer is stacked on the FePt layer, and therefore, the overall magnetization direction is substantially perpendicular to the film plane.

After the formation of the CoFeB layer 35, a heat treatment is performed in nitrogen plasma, as shown in FIG. 11(b).

Through the heat treatment, the B in the CoFeB layer 35 in an amorphous state is detached, and the CoFeB layer 35 turns into a CoFe layer 35a in a crystallized state. A BN layer 40 is then formed on the CoFe layer 35a. The region in the vicinity of the upper face of the CoFe layer 35a may contain N.

As shown in FIG. 11(c), an artificial lattice 37 formed by stacking [Co/Pd] twice is then formed on the BN layer 40. Instead of [Co/Pd], [Co/Pt] may be stacked twice to form the artificial lattice 37. The artificial lattice 37 and the CoFe layer 35a form ferromagnetic coupling, and constitute the magnetic recording layer 34 in combination. A Ta layer as the spacer layer 45 is then formed on the artificial lattice 37, and a [Co/Pd] artificial lattice film as the bias layer 47 for magnetic field adjustment is formed on the Ta layer 45. Incidentally, a [Co/Pt] artificial lattice film as the bias layer 47 can be used. After that, the upper electrode 48 made of Ru, for example, is formed on the bias layer 47, to form a magnetoresistive element. A 1-hour heat treatment is then performed at 300° C., to complete the magnetoresistive element of the third embodiment.

In the third embodiment, a heat treatment in nitrogen plasma is also performed after the formation of the CoFeB layer 35. Accordingly, a high MR ratio can also be achieved in the third embodiment. Furthermore, in the third embodiment, the B nitride (BN) formed by the heat treatment performed in nitrogen plasma can prevent the Pd in an artificial lattice [Co/Pd] 37 or the Pt in an artificial lattice [Co/Pt] 37 from diffusing into the CoFe layer 35a and the MgO layer 36. Accordingly, in the third embodiment, degradation of the MR ratio can be prevented, and high heat resistance during the heat treatment performed after the formation of the MTJ film can be achieved.

The B nitride (the BN layer 40) is a high-resistance layer. Therefore, to adjust resistance and reinforce the magnetic exchange coupling (ferromagnetic coupling) formed between the CoFe layer 35a and the artificial lattice 37, the B nitride may be removed by ion etching with the use of an Ar or Kr gas or the film thickness of the BN layer 40 may be reduced, as in the second embodiment. Here, it is necessary to perform the etching with such a small energy as not to damage the CoFe layer 35a, the MgO layer 36, and the magnetic reference layer 38 during the etching with the use of an Ar or Kr gas. After the removal of the BN layer 40, the region in the vicinity of the upper face of the CoFe layer 35a may contain N.

In the third embodiment, a heat treatment in nitrogen plasma is performed after the formation of a MTJ film, as in the second embodiment. That is, a heat treatment is performed at a low temperature. Accordingly, crystallization of the CoFeB layer on the MgO layer can be accelerated, and a high MR ratio can be achieved.

Next, the conditions for the nitrogen plasma heat treatment used in the above described first through third embodiments are described.

When a heat treatment in nitrogen plasma is performed, it is preferable to use RTA (Rapid Thermal Annealing) and perform a short-time heat treatment at the highest temperature as possible, to prevent nitriding of Fe and nitriding of Co. For example, only B can be nitrided more effectively by performing a heat treatment for several tens of seconds at a temperature of 400° C. than by performing a heat treatment in a nitrogen atmosphere for about one hour at 300° C.

Fourth Embodiment

Figure 12:
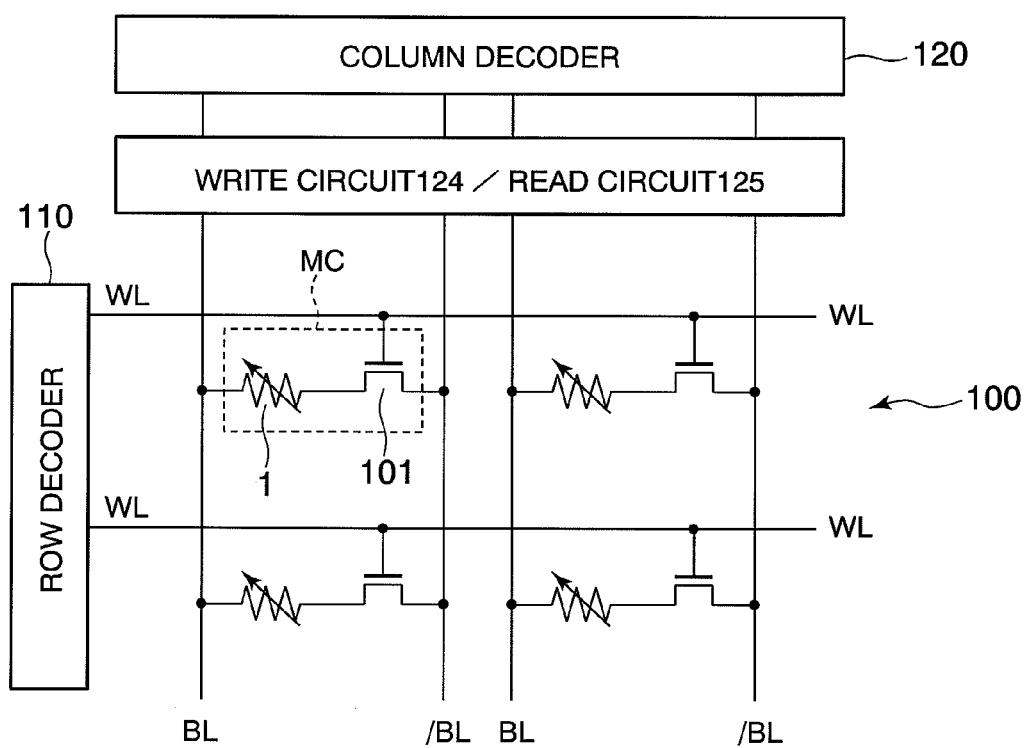
FIG. 12 is a circuit diagram of a magnetic memory according to a fourth embodiment.

Referring now to FIG. 12, a magnetic memory (MRAM) according to a fourth embodiment is described.

FIG. 12 is a circuit diagram of the MRAM of this embodiment. The MRAM of this embodiment uses magnetoresistive elements 1 of one of the first through third embodiments as the memory elements of memory cells. The MRAM includes a memory cell array 100 that has memory cells MC arranged in a matrix fashion. In the memory cell array 100, pairs of bit lines BL and /BL are provided to extend in the column direction. In the memory cell array 100, word lines WL are also provided to extend in the row direction.

The memory cells MC are placed at the respective intersection points of the bit lines BL with the word lines WL. Each of the memory cells MC includes a magnetoresistive element 1 and a select transistor 101 formed by an n-channel MOS transistor. One end of each magnetoresistive element 1 is connected to each corresponding bit line BL. The other end of each magnetoresistive element 1 is connected to the drain terminal of each corresponding select transistor 101. The gate terminal of each select transistor 101 is connected to each corresponding word lines WL. The source terminal of each select transistor 101 is connected to each corresponding bit line /BL.

A row decoder 110 is connected to the word lines WL. A write circuit 124 and a read circuit 125 are connected to the pairs of bit lines BL and /BL. A column decoder 120 is connected to the write circuit 124 and the read circuit 125. Each of the memory cells MC is selected through the row decoder 110 and the column decoder 120.

Data is written into a memory cell MC in the following manner. First, to select a memory cell MC on which writing is to be performed, the word line WL connected to the memory cell MC is activated. As a result, the corresponding select transistor 101 is switched on. A bidirectional write current Iw is supplied to the magnetoresistive element 1 according to write data. Specifically, when the write current Iw is supplied to the magnetoresistive element 1 from left to right in FIG. 12, the write circuit 124 applies a positive voltage to the bit lines BL, and a ground voltage to the bit lines /BL. When the write current Iw is supplied to the magnetoresistive element 1 from right to left in FIG. 12, the write circuit 124 applies a positive voltage to the bit lines /BL, and a ground voltage to the bit lines BL. In this manner, data "0" or data "1" can be written into the memory cell MC.

Data is read from a memory cell MC in the following manner. First, to select a memory cell MC from which data is to be read, the word line WL connected to the memory cell MC is activated. As a result, the select transistor 101 of the selected memory cell MC is switched on. The read circuit 125 supplies the corresponding magnetoresistive element 1 with a read current Ir flowing from right to left in FIG. 12, for example. Based on the read current Ir, the read current 125 detects the resistance value of the magnetoresistive element 1. In this manner, the data stored in the magnetoresistive element 1 can be read.

According to this embodiment, a MRAM can be formed by using magnetoresistive elements 1 according to one of the first through third embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetoresistive element comprising:
a first ferromagnetic layer;
a tunnel barrier layer over the first ferromagnetic layer;
a second ferromagnetic layer placed over the tunnel barrier layer, the second ferromagnetic layer comprising cobalt-iron (CoFe); and
a first nonmagnetic layer placed over the second ferromagnetic layer, the second ferromagnetic layer comprising nitrogen and at least one of boron (B), tantalum (Ta), zirconium (Zr), aluminum (Al), or cerium (Ce), wherein the first and second ferromagnetic layers have magnetic anisotropy in a direction parallel to a film plane, further comprising:
a second nonmagnetic layer placed over the first nonmagnetic layer; and
a third ferromagnetic layer placed over the second nonmagnetic layer, comprising magnetic anisotropy in a direction parallel to the film plane,
the third ferromagnetic layer further comprising synthetic antiferromagnetic coupling to the second ferromagnetic layer, and further comprising an antiferromagnetic layer over the third ferromagnetic layer.

2. The magnetoresistive element according to claim 1, wherein one of the first and second ferromagnetic layers is a magnetic recording layer, and the other one of the first and second ferromagnetic layers is a magnetic reference layer.

3. A method of manufacturing a magnetoresistive element, comprising:
forming a tunnel barrier layer over a first ferromagnetic layer;
forming a second ferromagnetic layer in an amorphous state over the tunnel barrier layer, the second ferromagnetic layer comprising CoFe and at least one of B, Ta, Zr, Al, or Ce;
forming a third ferromagnetic layer over the second ferromagnetic layer, the third ferromagnetic layer comprises either an artificial lattice formed by stacking a stacked film of Pt and Co a plurality of times or an artificial lattice formed by stacking a stacked film of Pd and Co a plurality of times, and
performing a heat treatment using a nitrogen plasma, to transform the second ferromagnetic layer into a crystallized state and form a first nonmagnetic layer over the second ferromagnetic layer in the crystallized state, the first nonmagnetic layer comprising nitrogen and at least one of B, Ta, Zr, Al, or Ce, wherein the first and second ferromagnetic layers comprise magnetic anisotropy in a direction perpendicular to a film plane.

4. The method according to claim 3, wherein the first ferromagnetic layer comprises a stacked structure comprising:
a layer comprising CoPd; and
a layer comprising CoFe, the layer comprising CoFe placed over the layer comprising CoPd.

5. A magnetic memory comprising:
the magnetoresistive element according to claim 1;
a first interconnect electrically connected to the first ferromagnetic layer of the magnetoresistive element via a first electrode; and
a second interconnect electrically connected to the second ferromagnetic layer of the magnetoresistive element via a second electrode.

6. The magnetic memory according to claim 5, further comprising a select transistor placed either between the first electrode and the first interconnect, or between the second electrode and the second interconnect.

7. A magnetoresistive element comprising:
a first ferromagnetic layer;
a tunnel barrier layer over the first ferromagnetic layer;
a second ferromagnetic layer placed over the tunnel barrier layer, the second ferromagnetic layer comprising cobalt-iron (CoFe); and
a first nonmagnetic layer placed over the second ferromagnetic layer, the second ferromagnetic layer comprising nitrogen and at least one of boron (B), tantalum (Ta), zirconium (Zr), aluminum (Al), or cerium (Ce), further comprising
a third ferromagnetic layer over the first nonmagnetic layer, the third ferromagnetic layer magnetically coupled to the second ferromagnetic layer, and the third ferromagnetic layer comprising magnetic anisotropy in a direction perpendicular to a film plane, wherein the first ferromagnetic layer has magnetic anisotropy in a direction perpendicular to the film plane, and wherein the third ferromagnetic layer comprises an artificial lattice formed by stacking a stacked film of Pt and Co a plurality of times or an artificial lattice formed by stacking a stacked film of Pd and Co a plurality of times.

8. The magnetoresistive element according to claim 7, wherein one of the first and second ferromagnetic layers is a magnetic recording layer, and the other one of the first and second ferromagnetic layers is a magnetic reference layer.

9. The magnetoresistive element according to claim 7, wherein the first ferromagnetic layer comprises a stacked structure comprising:
a layer comprising CoPd; and
a layer comprising CoFe, the layer comprising CoFe placed over the layer comprising CoPd.

10. The magnetoresistive element according to claim 7, wherein a bias layer for magnetic field adjustment is provided over either the opposite side of the first ferromagnetic layer from the tunnel barrier layer or the opposite side of the third ferromagnetic layer from the first nonmagnetic layer.

11. A magnetic memory comprising:
the magnetoresistive element according to claim 7;
a first interconnect electrically connected to the first ferromagnetic layer of the magnetoresistive element via a first electrode; and
a second interconnect electrically connected to the second ferromagnetic layer of the magnetoresistive element via a second electrode.

12. The magnetic memory according to claim 11, further comprising a select transistor placed either between the first electrode and the first interconnect, or between the second electrode and the second interconnect.

* * * * *